United States Patent
Vohra et al.

(12) 
(10) Patent No.: US 6,183,818 B1
(45) Date of Patent: Feb. 6, 2001

(54) PROCESS FOR ULTRA SMOOTH DIAMOND COATING ON METALS AND USES THEREOF

(75) Inventors: Yogesh K. Vohra; Shane A. Catledge, both of Birmingham, AL (US)

(73) Assignee: UAB Research Foundation, Birmingham, AL (US)

( * ) Notice: Under 35 U.S.C. 154(b), the term of this patent shall be extended for 0 days.

(21) Appl. No.: 09/409,502

(22) Filed: Sep. 30, 1999

Related U.S. Application Data

(60) Provisional application No. 60/102,693, filed on Oct. 1, 1998.
(51) Int. Cl.$^7$ ............................. C23C 16/26; H05H 1/24
(52) U.S. Cl. ........................................ 427/577; 427/249.8
(58) Field of Search ................................ 427/577, 249.8, 427/2.27

(56) References Cited

U.S. PATENT DOCUMENTS 5,055,318 * 10/1991 Deutchman et al. .................. 427/38
5,523,121 * 6/1996 Anthony et al. ..................... 427/249

* cited by examiner

*Primary Examiner*—Shrive Beck
*Assistant Examiner*—Bret Chen
(74) *Attorney, Agent, or Firm*—Benjamin Aaron Adler

(57) ABSTRACT

The present invention provides a new process to deposit well adhered ultra smooth diamond films on metals by adding nitrogen gas to the methane/hydrogen plasma created by a microwave discharge. Such diamond coating process is useful in tribological/wear resistant applications in bio-implants, machine tools, and magnetic recording industry.

12 Claims, 8 Drawing Sheets

PROCESS FOR ULTRA SMOOTH DIAMOND COATING ON METALS AND USES THEREOF

CROSS-REFERENCE TO RELATED APPLICATION

This non-provisional application claims benefit of priority of provisional application U.S. Ser. No. 60/102,693, filed Oct. 1, 1998, now abandoned.

FEDERAL FUNDING NOTICE

The present invention was funded in part by NASA and National Science Foundation (NSF). Consequently, the United States government has certain rights in this invention.

BACKGROUND OF THE INVENTION

1. Field of the Invention

The present invention relates generally to the fields of physics and chemistry. More specifically, the present invention relates to a new process which can deposit well adhered ultra smooth diamond films on metals with film roughness of 14 nanometers and hardness as high as 90% of that of a natural diamond crystal.

2. Description of the Related Art

The field of nanocrystalline diamond and tetrahedral amorphous carbon films has been the focus of intense experimental activity in the last few years for applications in field emission display devices, optical windows, and tribological coatings. Nanocrystalline chemical vapor deposited (CVD) diamond films have been synthesized from a variety of plasma feedgases including fullerenes or methane in argon (with and without hydrogen), as well as from methane/nitrogen plasmas[1-3].

It is generally agreed that the diamond grain size in these materials ranges from 3 to 30 nm and that the deposited films are smooth with a typical surface roughness of around 40 nm. Another class of carbon-based films called tetrahedral amorphous carbon can be grown by pulsed laser deposition[4], cathodic arc deposition[5], and ion deposition methods[6]. The $sp^3$ content in the tetrahedral amorphous carbon films can be as high as 85% and they can be made stress-free by thermal annealing[4].

The choice of substrate used in the studies mentioned above has been silicon typically. For metals, however, the thermal expansion mismatch between the diamond film and substrate gives rise to thermal stress which often results in delamination of the film[7]. To avoid this problem in conventional chemical vapor deposited diamond, low substrate temperatures (<700° C.) have been used, often with the incorporation of oxygen or carbon monoxide to the feedgas mixture[8]. Conventionally grown chemical vapor deposited diamond films are also rough and would require post-deposition polishing for most applications.

While nanocrystalline chemical vapor deposited diamond films have been well-characterized with respect to their structure and field-emission properties, surprisingly little information is published on the deposition of nano-structured diamond coatings on metals in which the issues of interfacial adhesion and film toughness are relevant for tribological applications.

The prior art lacks an effective means for deposition of well-adhered, smooth nano-structured diamond films on metals for various tribological applications. The present invention fulfills this long-standing need and desire in the art.

SUMMARY OF THE INVENTION

The present invention demonstrates successful synthesis of nano-structured diamond films on Ti-6Al-4V alloy (90% Ti, 6% Al, and 4% V by weight) and on molybdenum using a high density $CH_4/H_2$ plasma process. Also disclosed is that adding small amounts of nitrogen gas to such plasma process produces ultra smooth diamond films with surface roughness as low as 14 nanometers. The smooth diamond films are useful in tribological/wear resistant applications in bio-implants and machine tools, such as diamond coating of titanium implants, cobalt chrome femoral head and knee implants, and a magnetic video or audio tape and a recording head in a magnetic storage media.

The present invention further characterizes mechanical properties for nano-structured diamond films grown on a titanium alloy using a feedgas mixture involving an unconventionally high methane fraction (15% by volume) in nitrogen and hydrogen. It was found that the low root-mean-square (rms) surface roughness of 14 nm along with excellent interfacial adhesion, film toughness, and hardness makes these nano-structured coatings prime candidates for tribological applications.

In one embodiment of the present invention, there is provided a method of producing an ultra smooth diamond film, comprising the step of adding nitrogen gas to methane/hydrogen plasma created by a microwave discharge, wherein said plasma provides chemical vapor deposition for the production of said diamond film. Generally, the diamond film produced by the technique disclosed herein has a surface roughness of less than 100 nanometers and can be as low as 14 nanometers and a hardness as high as 90% of a single crystal diamond value. Such diamond film adheres well to metals. Preferably, the nitrogen gas is added to the process in the concentration range from about 2% to about 20% of the methane ($CH_4$) used in the plasma. The plasma process is run under a pressure range from about 100 Torr to about 150 Torr and a constant substrate temperature between 700° C. to 850° C. The preferred $CH_4$ fraction used in the plasma process is 5 to 15% $CH_4$ in a balance of $H_2$. The smoothest diamond films on metals are obtained when $CH_4$ to $H_2$ ratio is 15% and nitrogen to $CH_4$ ratio is 10%.

In another embodiment of the present invention, there is provided a method of depositing an ultra smooth diamond film on metals, comprising the step of adding nitrogen gas to methane/hydrogen plasma created by a microwave discharge, wherein said plasma provides chemical vapor deposition for depositing said diamond film on said metal. Preferably, nitrogen gas is added to the process in the concentration range from about 2% to about 20% of the methane ($CH_4$) used in the plasma. Generally, the metal can be titanium implant, cobalt chrome femoral head, knee implant, and a magnetic video or audio tape and a recording head in a magnetic storage media.

Other and further aspects, features, and advantages of the present invention will be apparent from the following description of the presently preferred embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate preferred embodiments of the invention and therefore are not to be considered limiting in their scope.

DETAILED DESCRIPTION OF THE INVENTION

Figure 1:
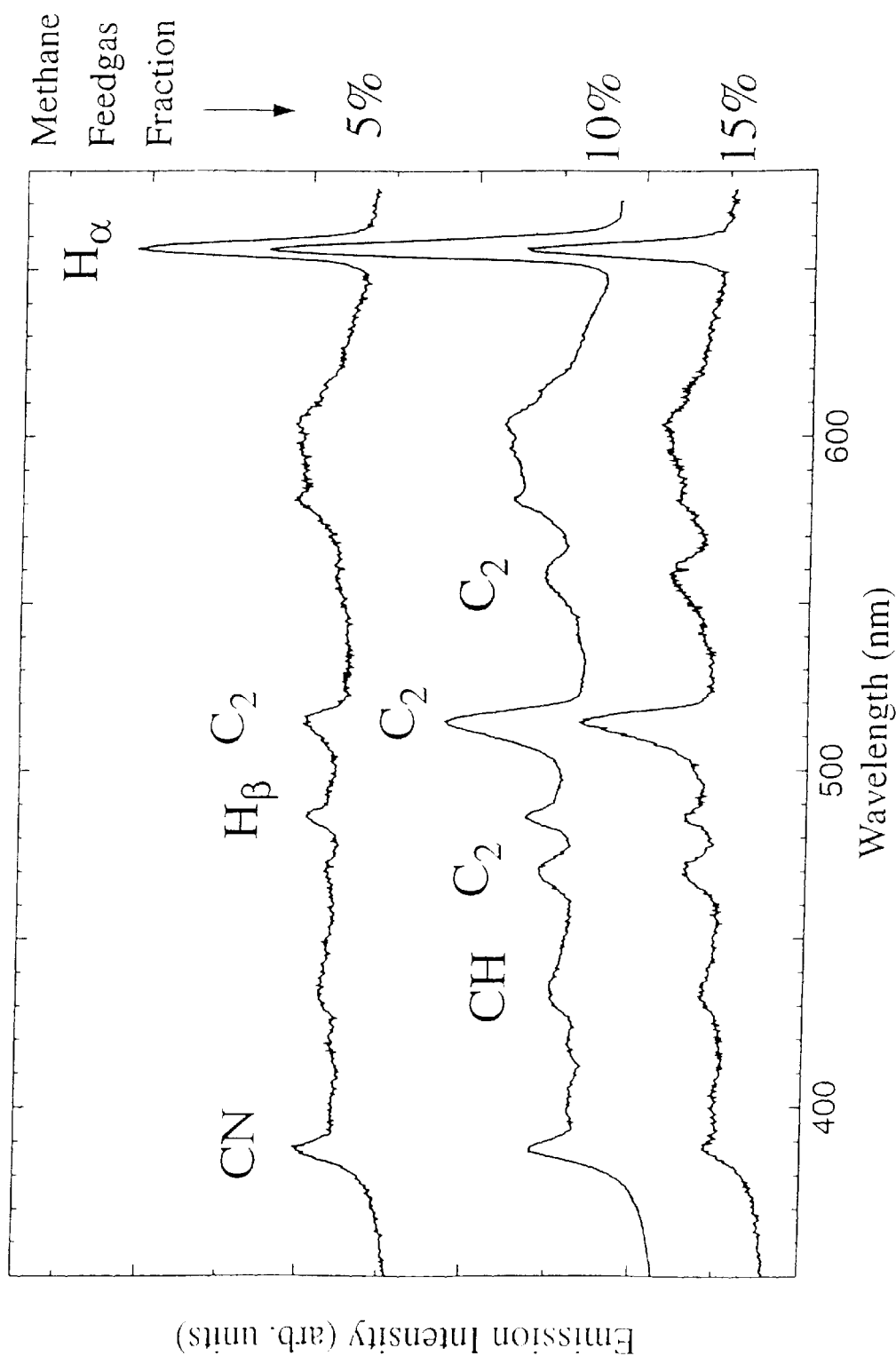
FIG. 1 shows optical emission spectra for high density plasma processing using high pressure (125 torr) and high methane (5–15%) conditions. The carbon dimer ($C_2$) peak at 515 nm is observed to increase with increasing methane fraction.

The present invention demonstrates a new regime for synthesis of nano-structured diamond films on Ti-6Al-4V alloy and molybdenum substrates using microwave plasma chemical vapor deposition (CVD) at high pressure (125 Torr) and high methane feedgas concentration (5 to 15% in a balance of hydrogen). These films are shown to be predominantly comprised of diamond nanocrystallites in a matrix of tetrahedral amorphous carbon.

In contrast to standard chemical vapor deposition conditions, the high density plasma results in adhered films on the metal substrates even at substrate temperatures of 850° C. These films are also significantly smoother than conventionally processed chemical vapor deposition diamond films and have an root-mean-square (rms) surface roughness of about 14 nm. The average grain size of these nanocrystalline diamond films is 13 nm as determined from x-ray diffraction data and the hardness of the films as determined from nanoindentation data is 90% that of natural diamond. Micro-Raman studies using 458 nm and 647.1 nm excitation indicate an increasing tetrahedral amorphous carbon content with increasing methane feedgas concentration. The adhesion and mechanical properties of these films makes them attractive for a variety of tribological applications.

Also disclosed in the present invention is that adding small amounts of nitrogen gas to the plasma process produces ultra smooth diamond films with surface roughness of as low as 14 nanometers. The smooth diamond films are useful in tribological/wear resistant applications in bio-implants, machine tools, and magnetic recording industry such as diamond coating of titanium implants, cobalt chrome femoral head and knee implants, and a magnetic video or audio tape and a recording head in a magnetic storage media.

In one embodiment of the present invention, there is provided a method of producing an ultra smooth diamond film, comprising the step of adding nitrogen gas to methane/hydrogen plasma created by a microwave discharge, wherein said plasma provides chemical vapor deposition for the production of said diamond film. Preferably, the diamond film produced has a surface roughness of less than 100 nanometers and can be as low as 14 nanometers and a hardness as high as 90% of a single crystal diamond value. Such diamond film adheres well to metals. In a preferred embodiment, nitrogen gas is added to the process in the concentration range of from about 2% to about 20% of the methane ($CH_4$) used in the plasma. The plasma process is run under a pressure range from about 100 Torr to about 150 Torr and a constant substrate temperature between 700° C. to 850° C. The preferred $CH_4$ fraction used in the plasma process is 5 to 15% $CH_4$ in a balance of $H_2$. The smoothest diamond films on metals are obtained when $CH_4$ to $H_2$ ratio is 15% and nitrogen to $CH_4$ ratio is 10%.

In another embodiment of the present invention, there is provided a method of depositing an ultra smooth diamond film on metals, comprising the step of adding nitrogen gas to methane/hydrogen plasma created by a microwave discharge, wherein said plasma provides chemical vapor deposition for depositing said diamond film on said metal. Preferably, nitrogen gas is added to the process in the concentration range from about 2% to about 20% of the methane ($CH_4$) used in the plasma. Typically, the metal can be titanium implant, cobalt chrome femoral head, knee implant, and a magnetic video or audio tape and a recording head in a magnetic storage media.

The following examples are given for the purpose of illustrating various embodiments of the invention and are not meant to limit the present invention in any fashion.

EXAMPLE 1

High Density Plasma Processing

The films were grown by a microwave plasma chemical vapor deposition system using $CH_4$ and $H_2$ feedgas mixtures. The 7 mm diameter polished substrate disks of Ti-6Al-4V alloy and molybdenum were seeded by ultrasonic agitation in a diamond powder/water solution. For each experiment, the operating pressure was 125 torr and the microwave power was 685 watts. This resulted in an average substrate temperature of 850±20° C. Three types of experiments were performed using $CH_4$ feedgas fractions of 5%, 10%, or 15% in a balance of $H_2$. Nitrogen was introduced into the plasma and the concentration of nitrogen was about 2% to about 20% of the methane concentration used in a controlled experiment. The plasma ball was about ¾" in diameter and located in contact with the upper surface of the substrate. The high density plasmas used in this study exhibited a distinct green color (especially at the higher $CH_4$ fractions) as a result of the abundance of the $C_2$ carbon dimer detected using optical emission spectroscopy (OES). Micro-Raman spectra were collected from the as-grown films using argon-ion (458 nm) and krypton-ion (647.1 nm) lasers. The crystallinity and grain size of the films were characterized by glancing-angle x-ray diffraction (XRD). The film growth rate was estimated using in-situ optical pyrometry as described elsewhere[9]. Film surface roughness was obtained using profilometry and the hardness/Young's modulus were determined from a NanoIndenter XP system. A summary of the experimental conditions and diamond film properties is provided in Table 1.

TABLE 1

Growth conditions and properties of nano-structured diamond films grown using high density plasma*

| Film Number | $CH_4/H_2$ Flow Rate (sccm) (% $CH_4$) | Estimated Average Growth Rate[a] (μm/hr) | Optical Emission $C_2/H\alpha$ Normalized Intensity[b] | RMS Surface Roughness (nm) | Hardness (GPa) | Average Grain Size (nm) |
|---|---|---|---|---|---|---|
| 1 | 26/500 (5%) | 0.9 | 24.5 | 74 ± 5 | 87 ± 16 | 14 |
| 2 | 56/500 (10%) | 2.2 | 57.9 | 52 ± 5 | 87 ± 12 | 12 |
| 3 | 88/500 (15%) | 2.7 | 112.2 | 47 ± 4 | 92 ± 11 | 13 |

*Residual nitrogen is present in the chamber, but the precise amount is unknown.
[a]Growth rate estimated from pyrometric interferometry technique (see ref. 9).
[b]OES integrated area intensity ratio normalized to $H\alpha$ = 100. Intensity from 515 nm $C_2$ peak used.

EXAMPLE 2
Ultra Smooth Nano-Structured Diamond Coatings

FIG. 1 shows the OES data taken of the plasma during growth of the three films deposited using 5%, 10%, and 15% $CH_4$ feedgas concentration. Of particular interest is the comparison of the integrated area intensity ratios of $C_2/H\alpha$ between the three films. Intense $C_2$ emission has been previously observed[1,2] during nanocrystalline diamond growth using argon with either fullerene or $CH_4$ feedgas. The $C_2$ emission was correlated with growth rate and suggested as the species responsible for nanocrystalline diamond film growth.

As seen in FIG. 1 and summarized in Table 1, the relative $C_2$ emission increases with increasing $CH_4$ fraction in the high density plasma process involving only $CH_4$ and $H_2$ feedgas. An increase in growth rate as well as a decrease in the average surface roughness (as low as 47 nm) with increasing $C_2$ emission was also observed. These results suggest that $C_2$ is also the dominant growth species in the high density $CH_4/H_2$ plasma process. The peak at 385 nm is attributed to a CN violet emission band which is due to residual nitrogen in the processing chamber.

All the nano-structured films in this study remained well-adhered to the substrate with the exception of films grown using 5% $CH_4$ fraction. This is in contrast to the conventional chemical vapor deposition process in which the diamond films grown on the same substrates would always delaminate at the substrate temperatures used here. The higher $C_2$ emission provided by the high density plasmas using 10% and 15% $CH_4$ fraction is expected to enhance the nucleation density and create a tougher interface.

Figure 2:
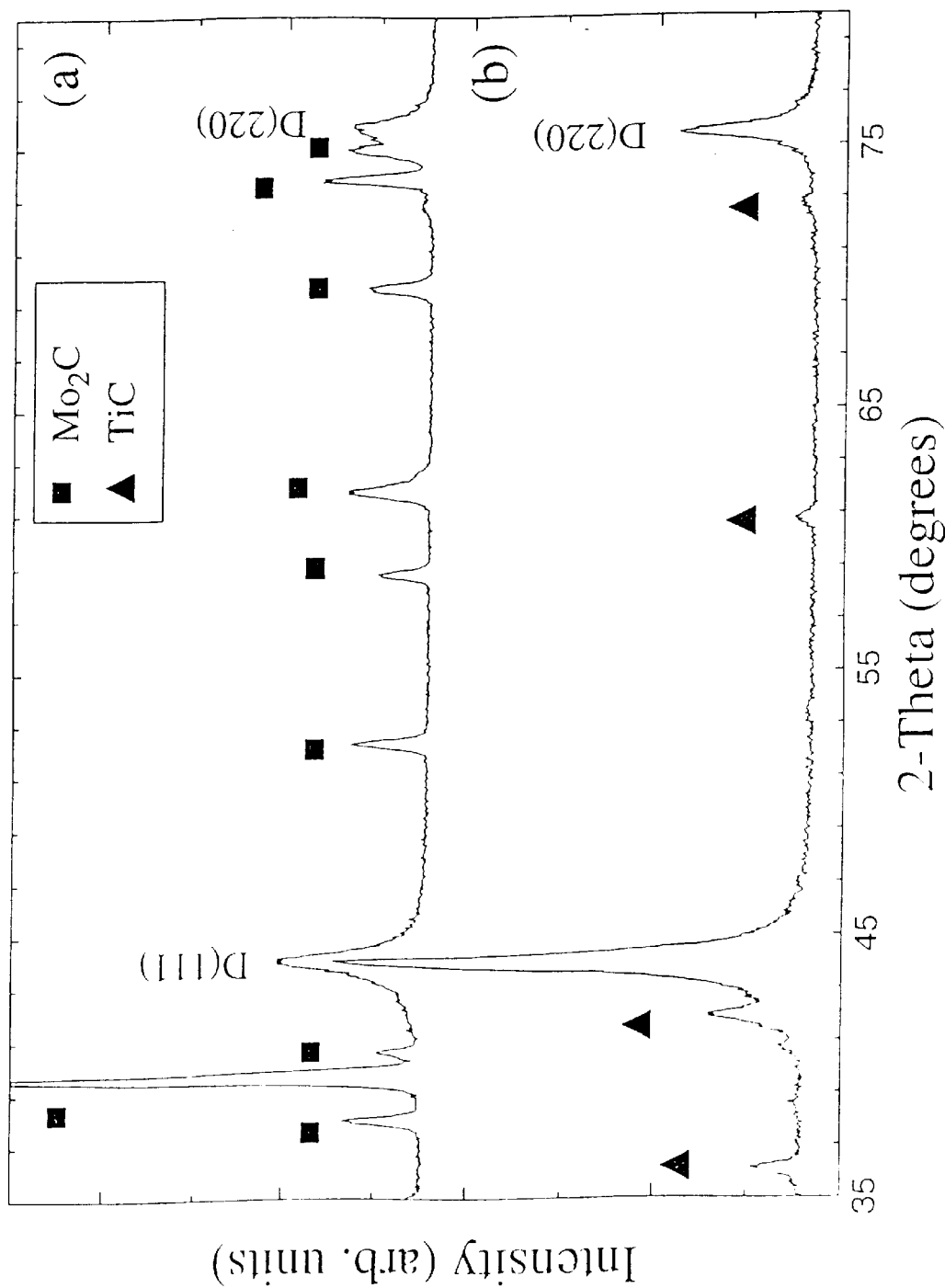
FIG. 2 shows glancing-angle x-ray diffraction patterns for high density plasma processed nano-structured diamond films on molybdenum (a) and Ti-6Al-4V alloy (b). The nano-structure of these films gives rise to broadening of the diamond diffraction peaks.

FIG. 2 shows the glancing angle XRD patterns for the nano-structured diamond films grown on molybdenum and Ti-6Al-4V alloy using a 10% $CH_4$ in $H_2$ feedgas mixture. Characteristic of these patterns is the cubic diamond (111) and (220) reflections as well as several peaks attributed to interfacial carbide phases. An increase was observed in the carbide/diamond XRD intensity ratio in going from the films grown with 5% $CH_4$ to those with 10–15%, suggesting that the improved adhesion of the higher $CH_4$-grown films may also be due to a thicker interfacial carbide layer. The diamond peaks are significantly broadened as compared to those obtained from the conventional chemical vapor deposition process. The average grain size was calculated from the diamond (111) peak width using the Sherrer formula and is shown in Table 1. Surprisingly, the average grain size (13 nm) did not change significantly for each of the films produced. Although the average grain size is the same for each film, there may be a significant difference in the distribution of grain sizes.

Figure 3:
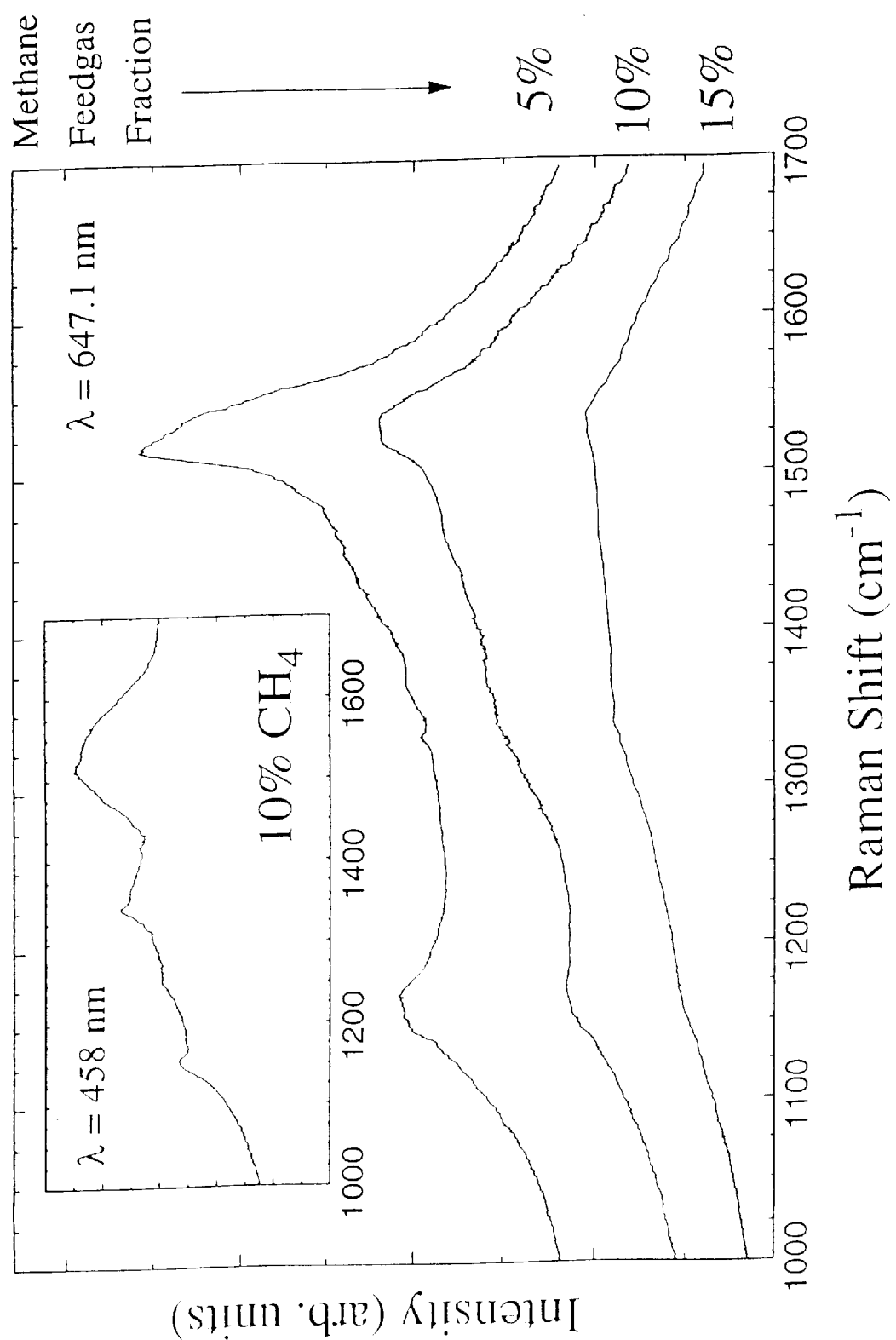
FIG. 3 shows micro-Raman spectra (excitation laser wavelength=647 nm) for high density plasma processed nano-structured diamond films on Ti-6Al-4V alloy at different $CH_4$ feedgas fractions. The inset shows the 10% $CH_4$-grown film using $\lambda$=458 nm excitation for comparison.

The micro-Raman spectra for each of the nano-structured diamond films on Ti-6Al-4V alloy are shown (FIG. 3). The 647.1 nm laser excitation was used because of its higher sensitivity to amorphous carbon components. The inset in FIG. 3 shows the micro-Raman spectrum for the film grown with 10% $CH_4$ using 458 nm excitation for comparison. The broad peak near 1150 $cm^{-1}$ is due to small or defective $sp^3$-bonded carbon nanocrystals[10]. As expected, the diamond peak near 1332 $cm^{-1}$ is seen more clearly when using the 458 nm laser excitation (see inset of FIG. 3). The broad band centered at 1530 $cm^{-1}$ was attributed to be primarily associated with tetrahedral amorphous carbon. This band has been observed as a large component in the Raman spectra of tetrahedral amorphous carbon[4]. The width and position of this Raman band for several types of amorphous carbon films has been correlated with hardness, optical band gap, and density[11]. It was shown that both hardness and density increase with increasing band width and that the optical band gap of hydrogenated amorphous carbon films increases with decreasing band position from 1570 $cm^{-1}$ to 1520 $cm^{-1}$. The hardest film grown with 15% $CH_4$ exhibits the largest width of the 1530 $cm^{-1}$ band as well as a decrease of the 1150 $cm^{-1}$ peak intensity as compared to the films grown with lower $CH_4$ fractions. This suggests an increase of the tetrahedral amorphous carbon component and a decrease of the nano-crystalline diamond component for the films grown with higher $CH_4$. The films produced by this process are "pseudo-composites" consisting of diamond nanocrystallites imbedded in a tetrahedral amorphous carbon matrix with a relatively small amount of graphitic carbon. The small graphitic component of the films is seen from the Raman components at 1350 $cm^{-1}$ and 1580–1600 $cm^{-1}$. The coexistence of nanocrystals in a tetrahedral amorphous network has been previously reported in carbon films deposited by filtered cathodic arc deposition[12].

Figure 4:
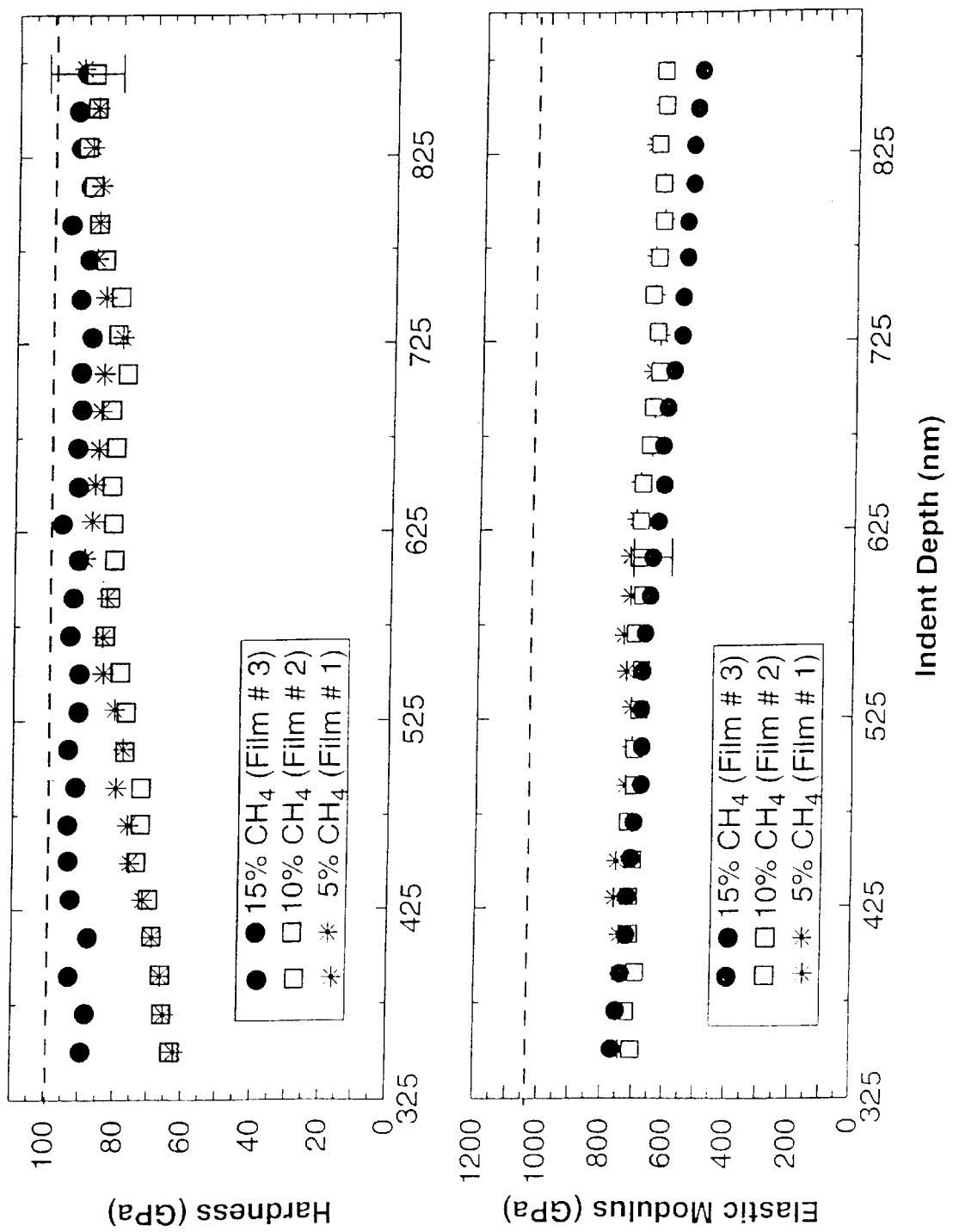
FIG. 4 shows hardness and elastic modulus vs. depth for high density plasma processed nano-structured diamond films at different $CH_4$ feedgas fractions. The dashed lines show the hardness and modulus values expected for single-crystal diamond. The hardness of the ultra smooth diamond films produced by this method is 90% of the value for a single crystal diamond, which is the hardest material known.

The hardness and modulus vs. indent depth for each of the three films grown on Ti-6Al-4V alloy corresponding to FIG. 3 are shown in FIG. 4. A fused silica standard was indented before indenting the films and after indenting each film in order to evaluate the diamond tip performance. In each case, the silica standard resulted in satisfactory hardness/modulus values of GPa/GPa, respectively. Since all films studied were at least 6 mm thick, substrate effects should be minimal for the 875 nm deep indents performed here. Each point represents the average of 10 separate indents and the error bars are determined from the standard deviation of these ten indents. Data for indent depths greater than 350 nm are shown here because the roughness of the surface prevented adequate contact of the indenter tip at lower depths. The film grown at 15% CH₄ resulted in the highest values of hardness and elastic modulus (92 GPa and 750 GPa, respectively). This film most likely contains the highest sp³ carbon content which, according to the Raman spectrum of FIG. 3, has a larger tetrahedral amorphous structure and less of a nanocrystalline structure than the other two films. For comparison, an un-coated Ti-6Al-4V alloy was indented and resulted in the expected values of hardness and modulus of 5 GPa and 120 GPa, respectively.

Figure 5:
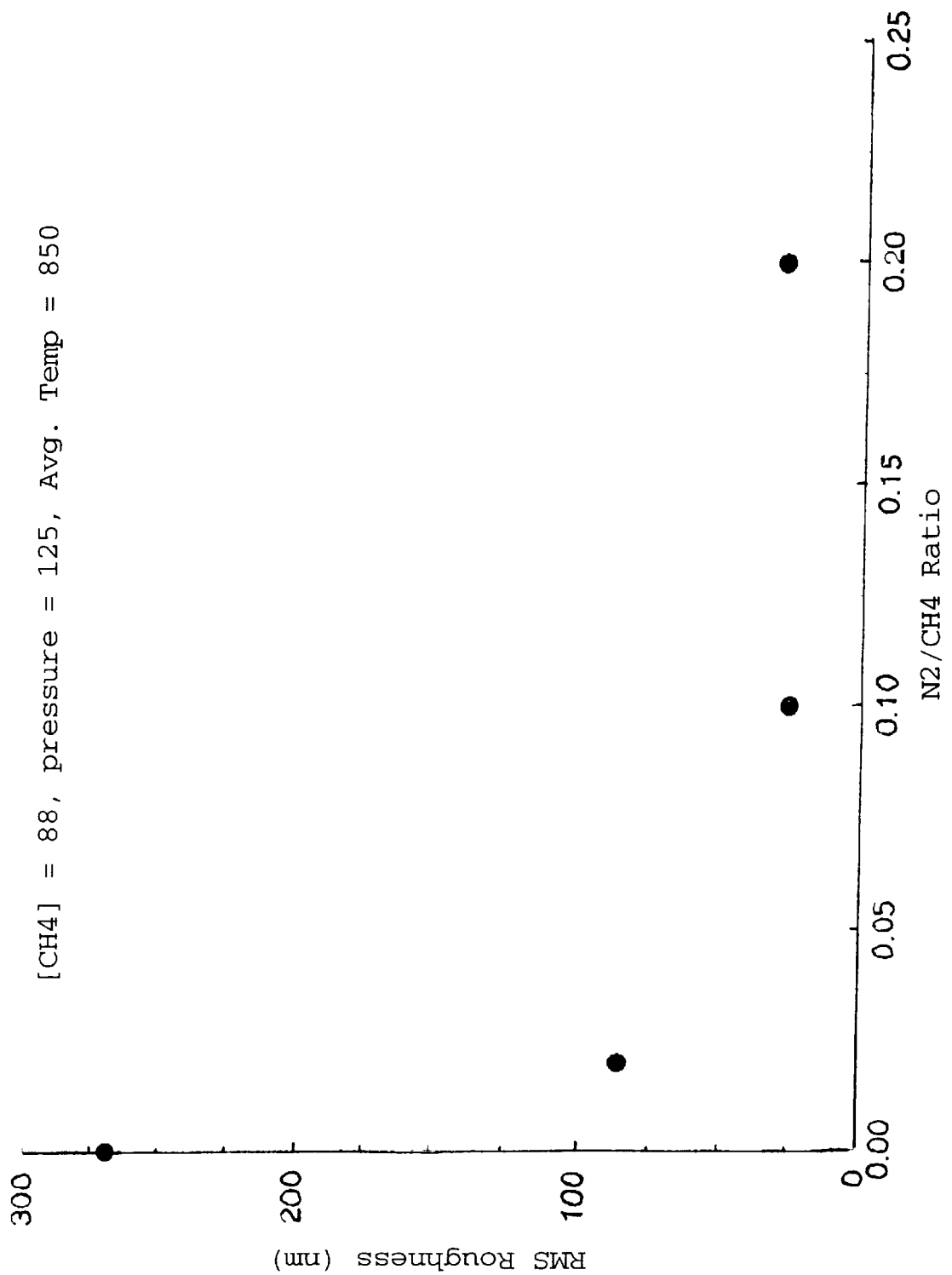
FIG. 5 shows smoothness of diamond films with increasing nitrogen concentration. In particular, nitrogen to methane ratio of 10% gives the best results in terms of smoothness of the film deposited.

The results of a series of controlled experiments carried out with calibrated amount of nitrogen gas are shown in FIG. 5. The smoothness of diamond films is increased when more nitrogen is added (FIG. 5). However, when $N_2/CH_4$ reaches 0.10, the smoothness no longer increases with the addition of nitrogen.

EXAMPLE 3
Indentation Testing

Circular substrates of 7 mm diameter and 1 mm thickness titanium alloy (Ti-6Al-4V) were prepared by a polishing sequence starting with SiC paper of 400-grit, 800-grit, and 1200-grit, followed by napped cloths charged with 3 µm diamond solution and then with 0.3 µm alumina solution. This resulted in an average root-mean-square (rms) surface roughness of 10 nm for the titanium alloy before deposition. The final preparation step involved seeding for 50 minutes in a 1–2 µm aqueous diamond powder solution in an ultrasonic bath, followed by rinsing and cleaning in water. Five diamond films were deposited using microwave plasma-assisted CVD with the following conditions: 125 Torr chamber pressure, 750–830 W microwave power, 825±25° C. substrate temperature, and flow rates of 500 sccm $H_2$, 88 sccm $CH_4$, and 8.8 sccm $N_2$. The five samples were grown under identical processing conditions in order to investigate the variation in the physical and mechanical properties of the nano-structured films. The average thickness of the five films as measured by pyrometric interferometry[9] was 4.0±0.4 µm and the rms surface roughness was 14±1 nm. The films were characterized by micro-Raman spectroscopy, x-ray diffraction (XRD), and scanning electron microscopy (SEM) and were found to be nearly identical in structure as those published elsewhere for films grown under similar conditions. Table 2 gives the average and standard deviation of several characterization parameters described in the present work.

TABLE 2

Average and standard deviation of several characterization parameters

|  | Mean | Standard Deviation |
|---|---|---|
| Film Thickness (µm) | 4.0 | 0.4 |
| RMS Surface Roughness (nm) | 14 | 1 |
| Percent Crystallinity (%) | 48 | 5 |
| Residual Stress (GPa) | 5.5 | 0.6 |
| % Strain for 30 kg Load | 0.7 | 0.1 |
| % Strain for 60 kg Load | 1.1 | 0.1 |
| % Strain for 100 kg Load | 1.9 | 0.1 |
| % Strain for 150 kg Load | 2.8 | 0.2 |

Figure 6:
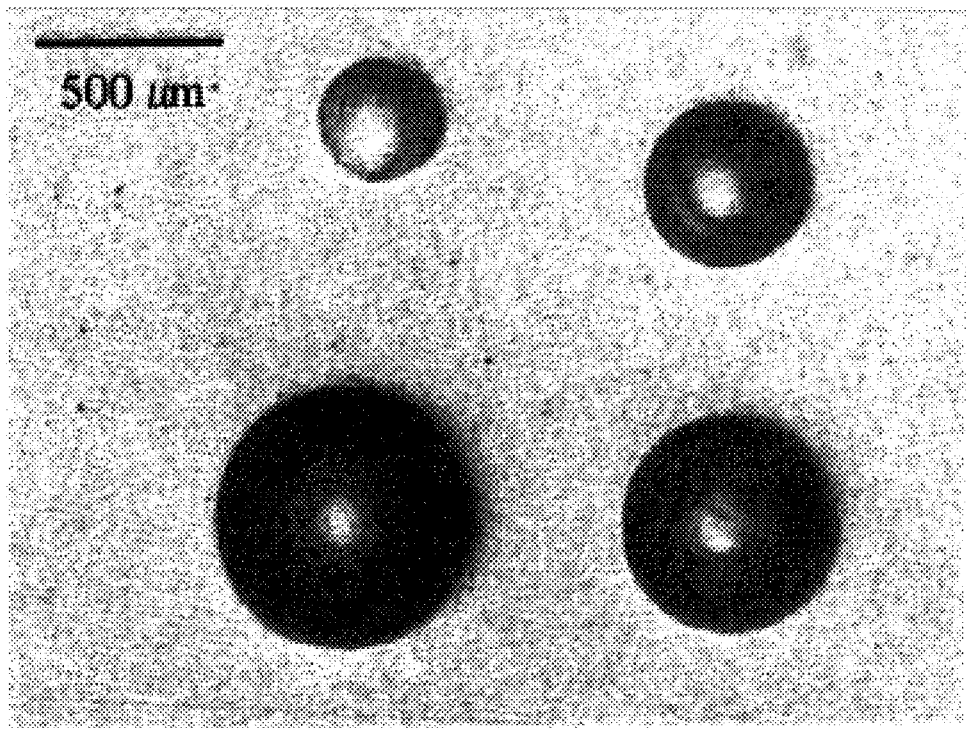
FIG. 6 shows optical micrographs of a set of four indentations on a diamond-coated titanium alloy. The indentation loads (clockwise from upper left) are 30 kg, 60 kg, 100 kg, and 150 kg. No film delamination was observed.
Figure 7:
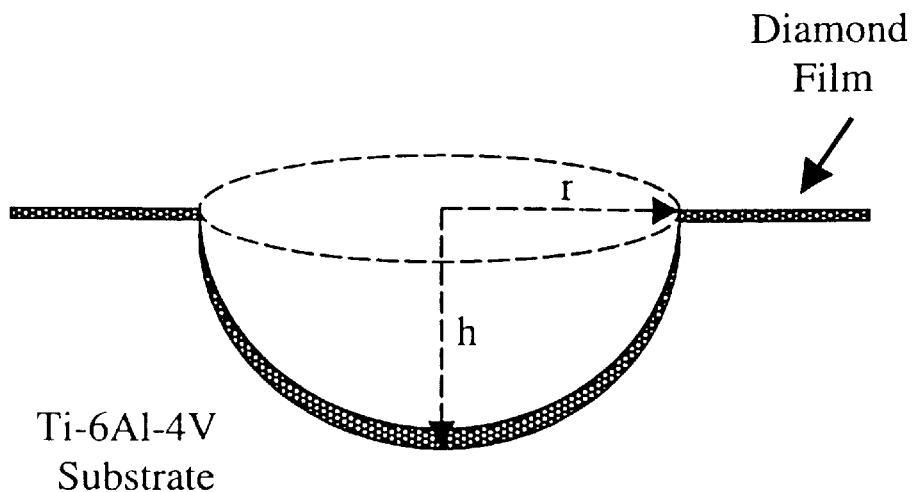
FIG. 7 shows a schematic of the indentation produced on diamond-coated Ti-6Al-4V demonstrating the parameters used to calculate film strain.

Each film was indented at loads of 30 kg, 60 kg, 100 kg, and 150 kg using a Rockwell indenter equipped with a ⅛ inch diameter tungsten carbide ball. FIG. 6 shows an optical micrograph of one typical set of indentations. None of the five coatings showed any sign of film delamination up to the highest load tested of 150 kg. The spherical indenter leaves an impression, which can be characterized with radius r and depth h as shown schematically in FIG. 7. The initial pre-indented circular surface area $A_i$ is given by:

$$A_i = \pi r^2 \quad (1)$$

After indentation, this initial area Ai is stretched to a spherical section $A_f$ given by:

$$A_f = 2\pi r h \quad (2)$$

The uniform strain in the film $\epsilon_f$ due to the indentation is:

$$\epsilon_f = (A_f - A_i)/A_i. \quad (3)$$

Figure 8:
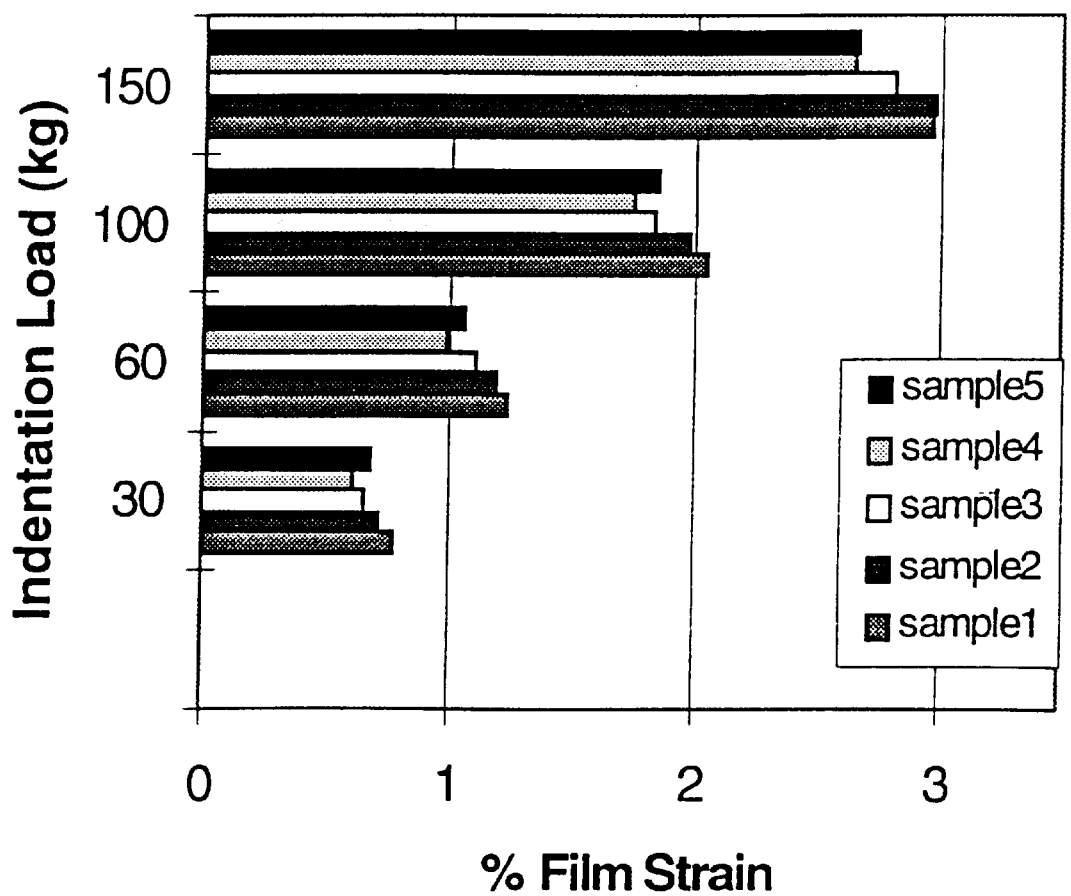
FIG. 8 shows film strain variation with indent load measured from indentation surface areas and their corresponding projected surface areas. The average strain at 100 kg load indents (1.9±0.1%) provides an upper limit of the strain to cause micro-cracking for these films.

EXAMPLE 4
Improved Interfacial Adhesion and Toughness of Nano-Structured Diamond Coatings FIG. 8 shows that the strains in the five films of this study were similar for a given indentation load. The films appear to be very well adhered to the metal substrate even in the presence of significant thermally-induced residual stress. The average stress of the five films was 5.5±0.6 GPa as measured by the Raman shift of the zone-center optical phonon of cubic diamond[13]. The thermal stress predicted from theory in which the same substrate temperature is assumed and in which the values of Young's modulus and Poisson's ratio for crystalline diamond (1050 GPa and 0.07, respectively) are used is 6.2 GPa[13]. However, it should be noted that present nanoindentation measurements of the nano-structured diamond films grown at the same processing conditions yielded Young's modulus and hardness values that were 67% and 90%, respectively, those of natural diamond. Since thermal stress is directly proportional to Young's modulus, the stress for the nano-structured diamond films is expected to be less than that of diamond coatings which are nearly 100% crystalline.

Grazing-angle XRD analysis of nearly 100% crystalline diamond films compared with the nano-structured diamond films reveals that the nano-structured films have about 48% relative diamond crystallinity. The non-crystalline composition of the nano-structured film is believed to be primarily tetrahedral-coordinated amorphous carbon with small $sp^2$-bonded clusters. The amorphous carbon component of these films can be expected to improve fracture toughness by limiting crack nucleation and by reducing the stress near existing cracks. Therefore, the excellent interfacial adhesion observed for these films (in comparison to crystalline diamond films) may be attributed to a reduction of residual film stress along with an increase in interfacial toughness.

Figure 9:
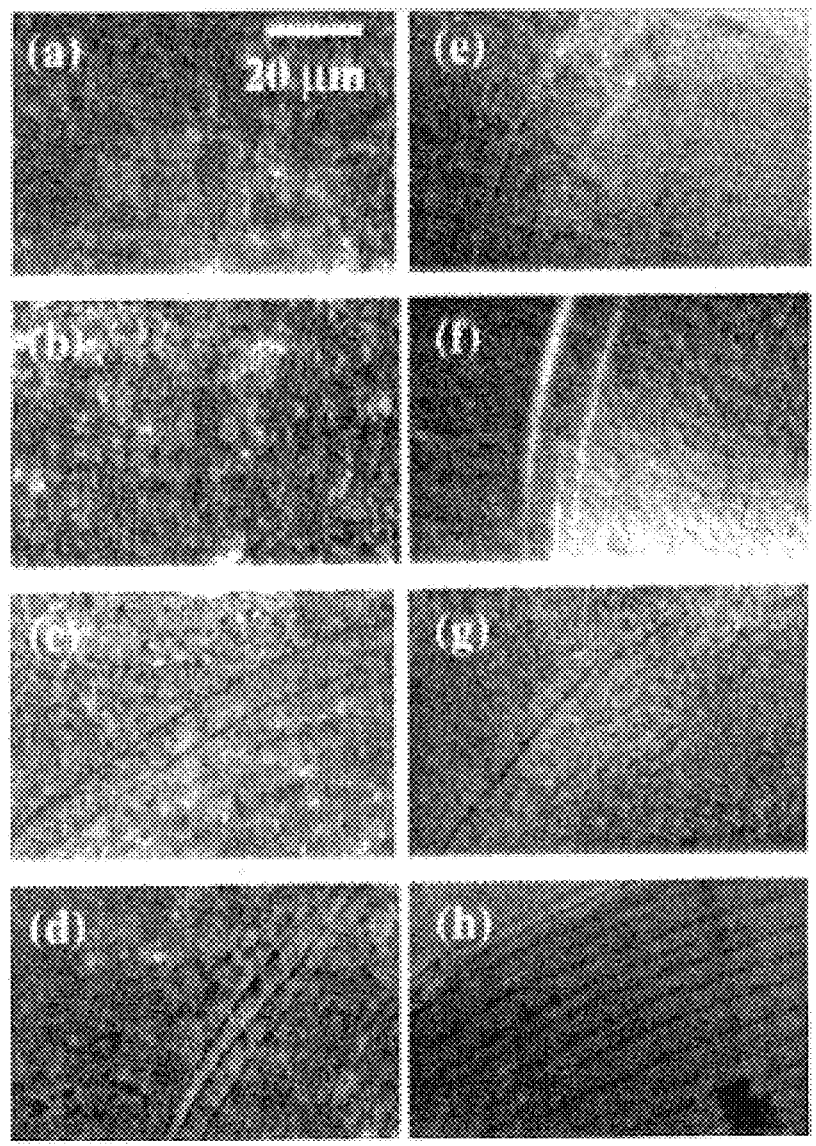
FIG. 9 shows SEM micrographs surrounding the indents produced from 30 kg to 150 kg indents. a–d: Indents from one sample at 30, 60, 100, and 150 kg loads, respectively. e–h: Indents at 150 kg loads from the remaining four samples.

SEM analysis revealed circumferential micro-cracking surrounding some of the indentations. FIG. 9 shows SEM micrographs surrounding the indents produced from 30 to 150 kg indents. Panels a–d show indents at 30, 60, 100, and 150 kg from one sample, while panels e–h shows indents from 150 kg loads from the remaining four samples. Despite the similar processing conditions, there was significant variation from sample to sample of the indentation load at which cracking became observable. For example, although micro-cracking was never observed for films indented at 30 kg (0.7% strain), some films showed micro-cracks at 60 kg (1.1% strain) while others did not show cracking until 150 kg (2.8% strain) loads were used. The number of circumferential cracks produced at a given load showed some variation from sample to sample as can be seen from FIG. 9 (e–h). When a 75 µm perpendicular test line was drawn from the outermost crack visible on 1000×micrographs toward the center of 150 kg indents of each of the samples, between three and twelve cracks were counted. The number of cracks observed did not appear to correlate with the small variations from sample to sample in film thickness, film strain, or percent crystallinity. Although the standard deviation of these parameters for all five films is small, an even tighter control of the CVD processing conditions may result in more consistent micro-cracking behavior between films. Despite the variation in film cracking when comparing the five films, the excellent interfacial adhesion and minimal cracking is encouraging.

Since no cracking was observed for any of the 30 kg indents, the average film strain at this load (0.7±0.1%) represents a lower limit of strain to cause micro-cracking. In addition, since some of the films did not show micro-cracking until 150 kg loads were used, the average film strain at 100 kg indents (1.9±0.1%) provides an upper limit of the strain to cause micro-cracking. This value of strain is indicative of a particularly ductile coating when compared to most ceramic materials. For example, for a predominantly crystalline diamond film in which almost no plastic flow is expected to occur before fracture or delamination, a strain of 1.9% would result in a biaxial stress in the film of:

$$\sigma = \epsilon_f \{E/(1-\nu)\} = 0.019 \{1050 \text{ GPa}/(1-0.07)\} = 22 \text{ GPa} \quad (4)$$

It is likely that this stress in a diamond film which is predominantly crystalline is too high to prevent fracture or delamination[13]. Clearly, the nano-structured diamond films in this study undergo elastic as well as significant plastic strain before fracture. Possible mechanisms of this plastic deformation include dislocation flow and/or nanometer-level cracking not observable by SEM. Future studies involving transmission electron microscopy will focus on these issues.

Discussion

The present invention demonstrates that successful deposition of adhered nano-structured diamond films on Ti-6Al-4V alloy and molybdenum substrates is possible using a high density plasma process for microwave plasma assisted chemical vapor deposition. The high pressure (125 torr) and high $CH_4$ fraction (5–15%) results in an intense emission of $C_2$ in the plasma and this can be correlated with growth rate, surface roughness, and film adhesion. Thin film XRD and profilometry reveals an average diamond grain size of 13 nm and a film roughness ranging from 14 to 74 nm, depending on the $CH_4$ concentration.

Micro-Raman spectroscopy using Krypton-ion laser excitation indicates that nano-crystalline diamond grains co-exist within a matrix of tetrahedral amorphous carbon. The "composite" nature and high hardness (~90 GPa) of these films makes them attractive for tribological applications.

Adding small amounts of nitrogen gas to the plasma process produces ultra-smooth diamond films. Such process advances traditional means of polishing diamond film, which is a very expensive and time consuming process. Conventionally, only rough diamond films (100–200 nm roughness) can be made and the films do not adhere well to metals. The present invention discloses methods for producing diamond films which not only adhere to metals but also are very smooth (14 nm smoothness). The smooth films are useful in tribological/wear resistant applications, bio-implants, machine tools, and magnetic recording industry.

The nano-structured diamond coatings disclosed in the present invention showed exceptional adhesion to the metal substrates as observed by indentation testing up to 150 kg load with a 1/8 inch diameter tungsten carbide ball. No film delamination was observed up to 150 kg indentation load for each of 5 samples grown under the same processing conditions. Scanning electron microscopy of the film surrounding the indentations revealed circumferential micro-cracking beginning at loads ranging from 60 kg to as high as 150 kg. The strain to cause film micro-cracking was estimated from calculations of indentation surface areas to be as high as 1.9±0.2%, which represents a significant improvement in toughness over other ceramic coatings. The high hardness, low surface roughness, excellent interfacial adhesion, and resiliency of these coatings makes them prime candidates for tribological applications.

The following references were cited herein.
1. Gruen et al., Appl. Phys. Lett. 64, 1502 (1994).
2. Zhou et al., J. Appl. Phys. 83, 540 (1998).
3. Zhou et al., J. Appl. Phys. 82, 4546 (1997).
4. Friedmann et al., App. Phys. Lett. 71, 3820 (1997).
5. Anders et al., Appl. Phys. Lett. 71, 3367 (1997).
6. Lifshitz et al., Diamond Relat. Mater. 4, 318 (1995).
7. Drory et al., Science 263, 1753 (1994).
8. Catledge et al., Thin Films—Stresses and Mechanical Properties VII, eds. R. C. Cammarata, E. P. Busso, M. Nastasi, and. W. C. Oliver, (Mater. Res. Soc. Symp. Proc. 505, 1997, Pittsburgh, Pa.).
9. Catledge et al., Appl. Phys. Lett. 73, 181 (1998).
10. Yarbrough et al., Science 247, 688 (1990).
11. Tamor et al., J. App. Phys. 76, 3823 (1994).
12. Silva et al, Appl. Phys. Lett. 69, 491 (1996).
13. Ager et al., Phys. Rev. B 48, 2601 (1993).

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. The present examples along with the methods, procedures, treatments, molecules, and specific compounds described herein are presently representative of preferred embodiments, are exemplary, and are not intended as limitations on the scope of the invention. Changes therein and other uses will occur to those skilled in the art which are encompassed within the spirit of the invention as defined by the scope of the claims.

What is claimed is:

1. A method of producing an ultra smooth diamond film having a surface roughness in the range of about 14 nanometers to about 100 nanometers, comprising the step of:
    adding nitrogen gas to methane/hydrogen plasma created by a microwave discharge, wherein said plasma provides chemical vapor deposition for the production of said diamond film.

2. The method of claim 1, wherein said diamond film has a hardness up to 90% of a single crystal diamond value.

3. The method of claim 1, wherein said diamond film adheres to metals.

4. The method of claim 1, wherein said nitrogen gas is added in the concentration range from about 2% to about 20% of the methane ($CH_4$) used in said plasma.

5. The method of claim 4, wherein said nitrogen gas is 10% of the methane used in said plasma.

6. The method of claim 1, wherein said chemical vapor deposition is under a pressure range from about 100 Torr to about 150 Torr.

7. The method of claim 1, wherein said plasma uses $CH_4$ in the concentration range of 5% to 15% in a balance of $H_2$.

8. The method of claim 7, wherein said $CH_4$ is 15% of $H_2$ used in said plasma.

9. The method of claim 1, wherein said chemical vapor deposition is held under a constant substrate temperature between 700° C. to 850° C.

10. A method of depositing an ultra smooth diamond film having a surface roughness in the range of about 14 nanometers to about 100 nanometers on a metal, comprising the step of:

adding nitrogen gas to methane/hydrogen plasma created by a microwave discharge, wherein said plasma provides chemical vapor deposition for depositing said diamond film on said metal.

11. The method of claim 6, wherein said nitrogen gas is added in the concentration range from about 2% to about 20% of the methane ($CH_4$) used in said plasma.

12. The method of claim 10, wherein said metal is selected from the group consisting of titanium implant, cobalt chrome femoral head, knee implant, and a magnetic video or audio tape and a recording head in a magnetic storage media.

* * * * *